United States Patent
Han et al.

(10) Patent No.: US 9,815,086 B2
(45) Date of Patent: Nov. 14, 2017

(54) VIBRATOR AND ELECTRONIC DEVICE INCLUDING THE SAME

(71) Applicant: SAMSUNG ELECTRO-MECHANICS CO., LTD., Suwon-Si (KR)

(72) Inventors: Sang Hun Han, Suwon-Si (KR); Sung Chan Park, Suwon-Si (KR); Hun Gyu Park, Suwon-Si (KR); So Jung Cho, Suwon-Si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 479 days.

(21) Appl. No.: 14/585,195

(22) Filed: Dec. 30, 2014

(65) Prior Publication Data

US 2015/0214467 A1 Jul. 30, 2015

(30) Foreign Application Priority Data

Jan. 28, 2014 (KR) .................. 10-2014-0010138

(51) Int. Cl.
| | | |
|---|---|---|
| H01L 41/04 | (2006.01) |
| B06B 1/06 | (2006.01) |
| H01L 41/09 | (2006.01) |
| H01L 41/313 | (2013.01) |
| B06B 1/10 | (2006.01) |

(52) U.S. Cl.
CPC .............. *B06B 1/0603* (2013.01); *B06B 1/10* (2013.01); *H01L 41/0933* (2013.01); *H01L 41/313* (2013.01)

(58) Field of Classification Search
CPC .............. H01L 41/053; H01L 41/0533; H01L 41/0933; B06B 1/0603; B06B 1/14
USPC ........................................................ 310/328
See application file for complete search history.

(56) References Cited

U.S. PATENT DOCUMENTS

| | | | | |
|---|---|---|---|---|
| 9,660,172 | B2 * | 5/2017 | Moon | H01L 41/0475 |
| 2014/0285064 | A1 * | 9/2014 | Kim | B06B 1/0644 |
| | | | | 310/317 |
| 2014/0346926 | A1 * | 11/2014 | Choi | H02N 2/006 |
| | | | | 310/323.01 |
| 2015/0008793 | A1 * | 1/2015 | Park | B06B 1/0648 |
| | | | | 310/323.01 |
| 2015/0188027 | A1 * | 7/2015 | Moon | H01L 41/053 |
| | | | | 310/329 |

FOREIGN PATENT DOCUMENTS

JP          7-213997          8/1995

* cited by examiner

*Primary Examiner* — J. San Martin
(74) *Attorney, Agent, or Firm* — LRK Patent Law Firm

(57) ABSTRACT

There are provided a vibrator and an electronic device including the same. The vibrator includes: a housing having an internal space; an elastic member having both ends fixed to the housing so as to be disposed in the internal space in a state in which elastic deformation is possible; and a piezoelectric element mounted on one surface of the elastic member, wherein the piezoelectric element is fixed to the elastic member by soldering.

12 Claims, 6 Drawing Sheets

VIBRATOR AND ELECTRONIC DEVICE INCLUDING THE SAME

CROSS-REFERENCE TO RELATED APPLICATION

This application claims the benefit of Korean Patent Application No. 10-2014-0010138 filed on Jan. 28, 2014, with the Korean Intellectual Property Office, the disclosure of which is incorporated in its entirety herein by reference.

BACKGROUND

The present disclosure relates to a vibrator and an electronic device including the same.

A vibrator, a device converting electrical energy into mechanical vibrations using the principle of the generation of electromagnetic force, is mounted in a mobile phone, or the like, to be used for silently notifying a user of call reception. In addition, as the market for mobile devices such as a mobile phones and the like has rapidly expanded and various functions have been added to such mobile devices, mobile devices having small size and high quality have been required. In this situation, the need for developing vibrators having new structures capable of overcoming disadvantages of existing products and significantly improving quality has increased.

Further, as the release of smartphones onto the market has rapidly increased, a touchscreen scheme has been adopted, such that the adoption of vibration motors has increased in order to generate vibrations at the time of a touch interaction with such a smartphone. Performance particularly required in the vibrations at the time of a touch interaction with a touchscreen is as follows. First, as the number of vibrations generation at the time of the touch interactions has increased to be greater than that of vibrations generation at the time of call reception, operational lifespans of vibrators needs to be increased. Second, in order to increase user satisfaction when a user encounters vibrations at the time of the touch interaction, a response speed of the vibrations needs to increase in accordance with a speed of a touch interaction with the screen.

As a product capable of implementing the characteristics as described above, there is provided a piezo haptic actuator. Such a piezo haptic actuator uses the principle of a converse piezoelectric effect, which generates displacement of a piezo element when a voltage is applied thereto, and vibrational force is generated by allowing a weight of a mass body to move by the generated displacement.

A vibrator having this structure may be characterized in that a frequency bandwidth capable of obtaining vibrational force at a predetermined level or more is wider, such that stable vibration characteristics may be implemented, and vibrations having a low or high frequency rather than a single frequency may be variously used within a predetermined frequency range. In addition, since the rapid operation response characteristics may be implemented, such a piezo haptic actuator may be suitable for implementing haptic vibrations in mobile devices such as mobile phones, and the like.

Meanwhile, a piezoelectric element generating vibrations as described above is mounted on an elastic member to thereby vibrate, but when an external impact (particularly, in an axial direction) is applied thereto, the piezoelectric element may be floated or separated from the elastic member.

That is, the piezoelectric element formed of a ceramic material may be coupled to an elastic member formed of a metal material by an adhesive, but coupling force of the adhesive is not strong enough to resist excessive external impacts, such that the piezoelectric element may be separated from the elastic member.

SUMMARY

An aspect of the present disclosure may provide a coupling structure capable of improving coupling strength between a piezoelectric element and an elastic member.

Another aspect of the present disclosure may provide a structure of a vibrator capable of exhibiting excellent performance in view of productivity.

According to an aspect of the present disclosure, a vibrator may include: a housing having an internal space; an elastic member having both ends fixed to the housing so as to be disposed in the internal space in a state in which elastic deformation is possible; and a piezoelectric element mounted on one surface of the elastic member, wherein the piezoelectric element is fixed to the elastic member by soldering.

The piezoelectric element may include a metal layer provided in a direction in which the piezoelectric element is coupled to the elastic member.

The metal layer may cover an entire surface of the piezoelectric element.

An insulating layer may be provided between the piezoelectric element and the metal layer.

The piezoelectric element may be fixed to the elastic member by soldering via solder cream.

The solder cream may be a mixture of any one of lead powder or tin powder and a flux.

The elastic member may include a bottom plate of which the piezoelectric element is mounted on one surface and an extension plate extended in a height direction from both ends of the bottom plate in a width direction.

The extension plate may include a connection part connected to the bottom plate and extended in the height direction from a central portion of the bottom plate in a length direction and a support plate part provided at the other end of the connection part in the length direction to guide a mass body.

According to another aspect of the present disclosure, a vibrator may include: a housing having an internal space; an elastic member having both ends fixed to the housing so as to be disposed in the internal space in a state in which elastic deformation is possible; and a piezoelectric element mounted on one surface of the elastic member, wherein the piezoelectric element is mounted on the elastic member after applying solder cream to the elastic member and fixed to the elastic member by a reflow method.

The piezoelectric element may include a metal layer provided at a portion thereof mounted on the solder cream.

According to another aspect of the present disclosure, an electronic device may include: a display module displaying an image depending on selection of a user; a case having an internal space receiving the display module; and a vibrator including a housing mounted in the case and having an internal space, an elastic member mounted in the internal space, a piezoelectric element mounted on one surface of the elastic member and vibrating the elastic member by deformation, and a mass body coupled to the piezoelectric element or elastic member while absorbing shocks.

The vibrator may be mounted on an inner surface of the case.

The vibrator may be mounted on a lower surface of the display module.

The display module may include: a touch panel receiving a touch interaction of a user; and a display panel coming in contact with a lower surface of the touch panel to provide a corresponding image depending the touch interaction with the touch panel.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
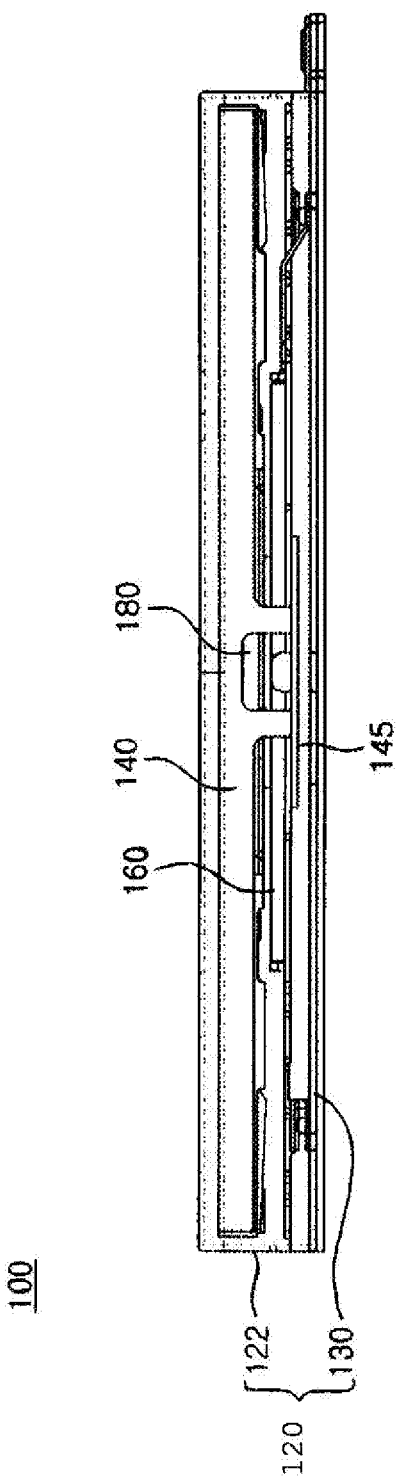
FIG. 1 is a cross-sectional view of a vibrator according to an exemplary embodiment of the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
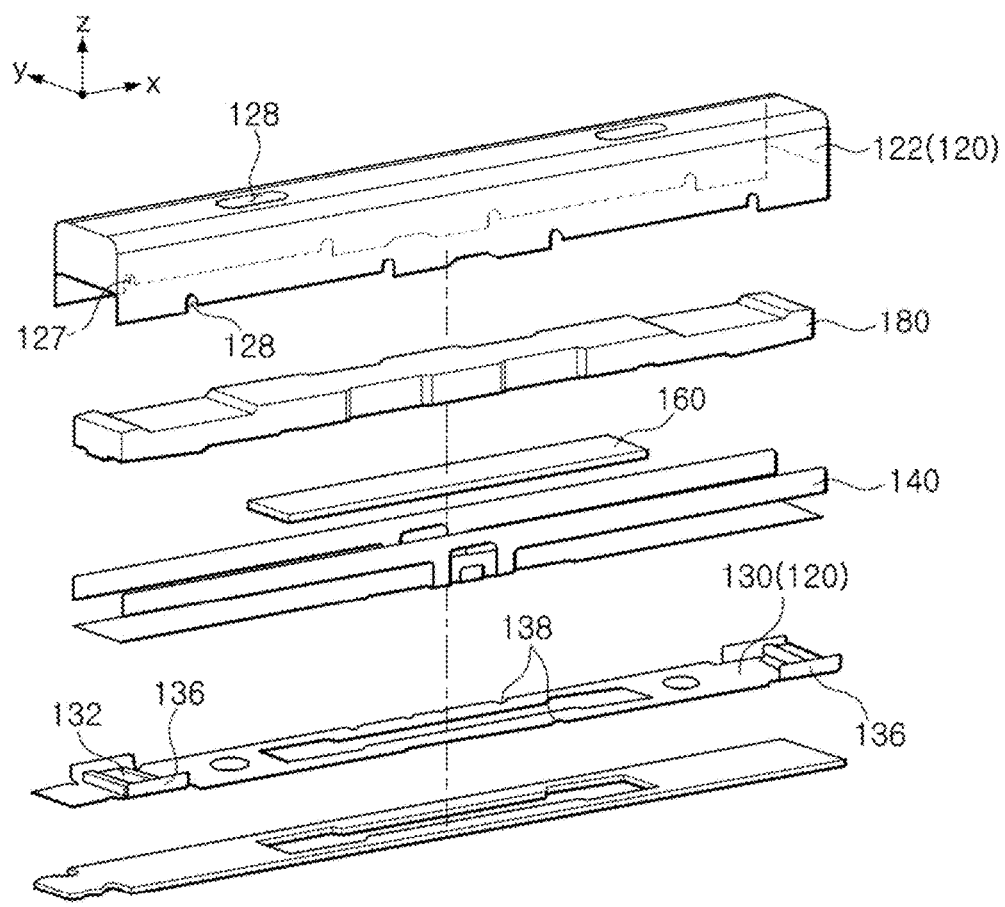
FIG. 2 is an exploded perspective view of the vibrator according to an exemplary embodiment of the present disclosure.

FIG. 1 is a cross-sectional view of a vibrator according to an exemplary embodiment of the present disclosure, and FIG. 2 is an exploded perspective view of the vibrator according to an exemplary embodiment of the present disclosure.

Referring to FIGS. 1 and 2, a vibrator 100 may include a housing 120 including an upper case 122 and a lower case 130, an elastic member 140, a piezoelectric element 160, a mass body 180, and a circuit board (not shown).

The housing 120 may include the upper and lower cases 122 and 130. In addition, the upper case 122 may have a box shape having an internal space, and the lower case 130 may have a plate shape.

In addition, as described above, the upper case 122 may have the box shape. That is, the upper case 122 may be configured of a front plate, a side plate, a back plate, and an upper plate.

In addition, a plurality of grooves 127 for coupling with the lower case 130 may be formed in the front plate and the back plate.

Further, vent holes 128 for movement of air may be formed in the upper plate.

Here, terms with respect to directions will be defined. As viewed in FIG. 2, a length direction refers to an X direction, and a width direction refers to a Y direction. In addition, a height direction refers to a Z direction in FIG. 2. Further, the terms defined as described above will be equally used below. That is, in describing each configuration, the terms will refer to the same directions as those described above.

The lower case 130 may have the plate shape as shown in FIG. 2. In addition, both end portions of the lower case 130 may be provided with protrusion parts 132 supporting both end portions of the elastic member 140 (See FIG. 1). The protrusion part 132 may be formed by denting and have a square pillar shape. However, this is only an example, and the present disclosure is not limited thereto.

In addition, the both end portions of the lower case 130 may be provided with coupling wall parts 136 increasing coupling force with the upper case 122.

Meanwhile, both side surfaces of the lower case 130 may be formed with a plurality of grooves 138 corresponding to the grooves 127 of the upper case 122.

Figure 3:
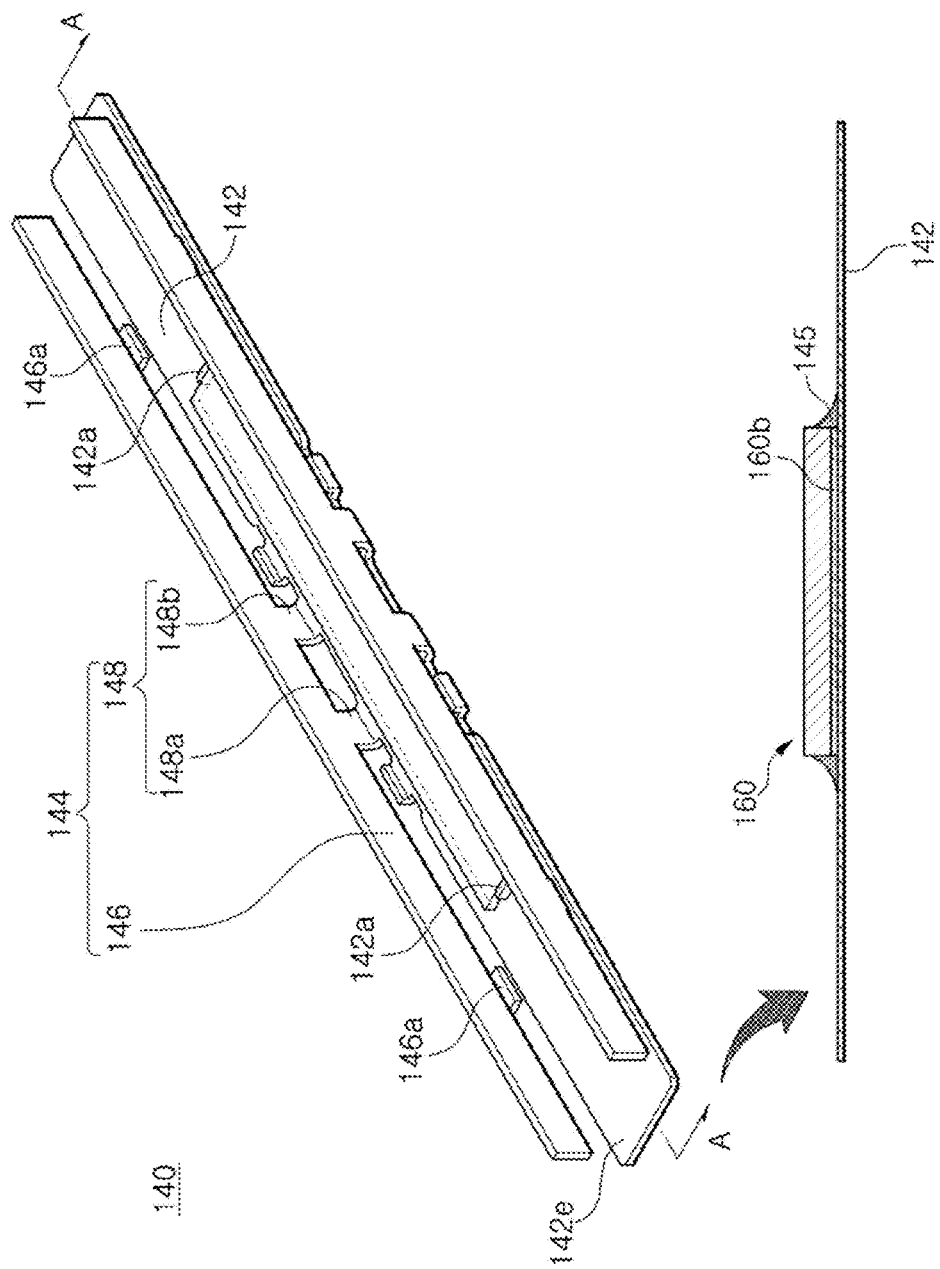
FIG. 3 is a perspective view illustrating an elastic member of the vibrator according to an exemplary embodiment of the present disclosure and a piezoelectric element coupled thereto.
Figure 4:
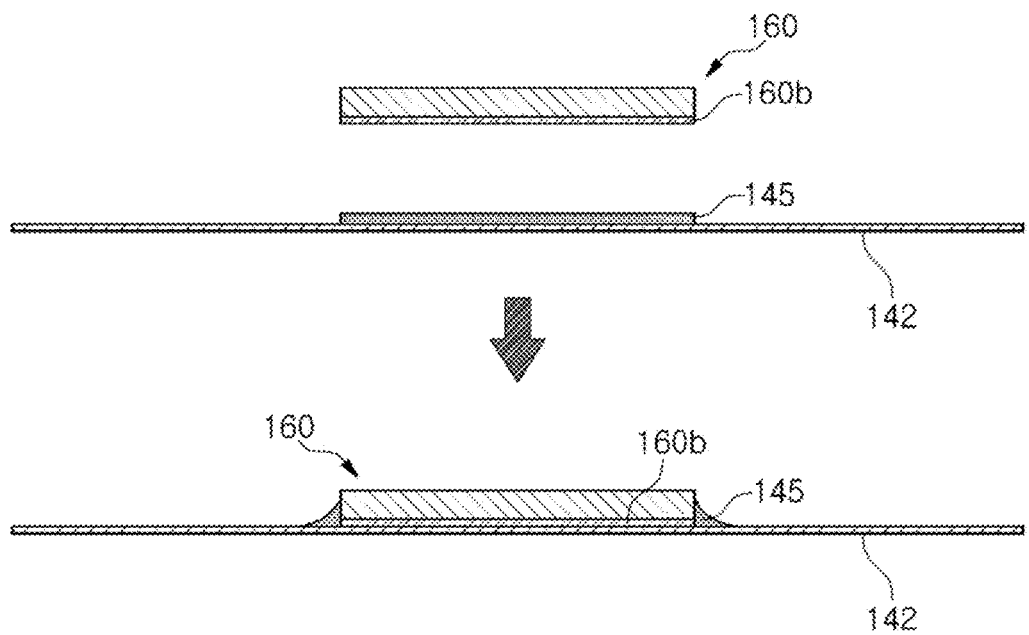
FIGS. 4 and 5 are reference views illustrating a manner in which the elastic member and the piezoelectric element are coupled to each other in an exemplary embodiment of the present disclosure.
Figure 5:
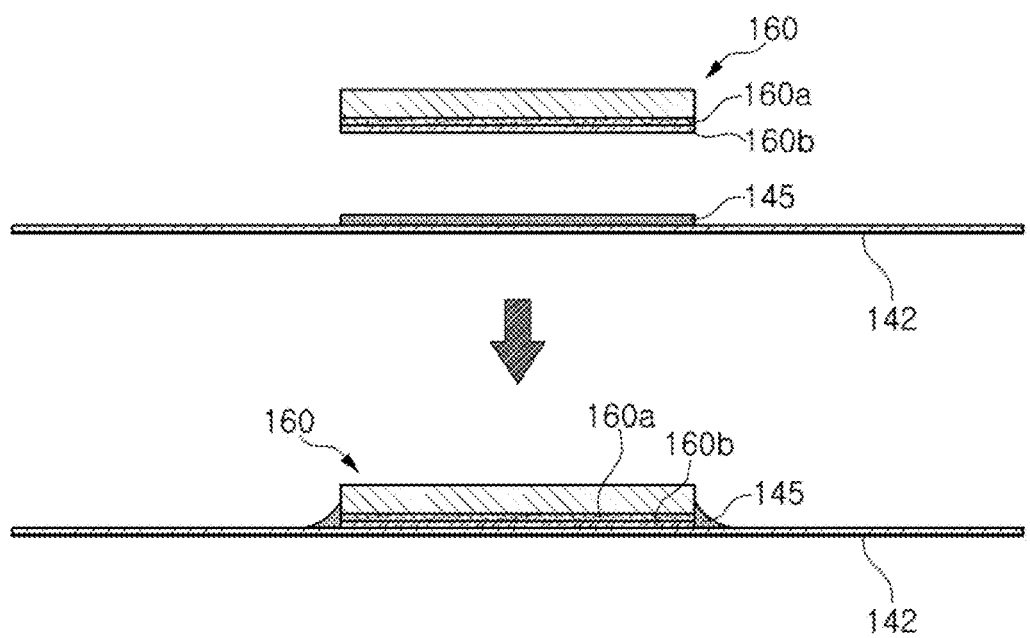

FIG. 3 is a plan view and a perspective view illustrating the elastic member of the vibrator according to an exemplary embodiment of the present disclosure.

Referring to FIG. 3, the elastic member 140 may include a bottom plate 142 and extension plates 144.

First, the bottom plate 142 of the elastic member 140 will be described. A plurality of support protrusions 142a for installing the piezoelectric element 160 (See FIG. 1) may be provided in the bottom plate 142. Two support protrusions 142a may support both side surfaces of the piezoelectric element 160. Therefore, the piezoelectric element 160 may be installed at a predetermined position, and separation of the piezoelectric element 160 from the bottom plate 142 may be prevented.

Meanwhile, an opening part (not shown) for electrically connecting a circuit board and the piezoelectric element 160 may be formed in the bottom plate 142. However, the opening part is not necessarily provided, and the circuit board may be connected to an upper surface of the piezoelectric element 160.

Further, both end portions of the bottom plate 142 may be provided with support parts 142e supported by the protrusion parts 132 of the lower case 130.

In addition, the extension plate 144 may include a support plate part 146 coming in contact with a front surface and a back surface of the mass body 180 and a connection part 148 connecting the support plate part 146 and the bottom plate 142 to each other.

The connection part 148 may be extended from a front surface and a back surface of the bottom plate 142. Further, the connection part may be configured of first and second connection parts 148a and 148b disposed to be spaced apart from each other by a predetermined interval.

In addition, the support plate part 146 may be extended in a length direction of the mass body 180.

Further, a lower end of the support plate part 146 may be provided with at least one support jaw 146a protruding so as to support the mass body 180 or a mass body cover 170 at a lower portion thereof. The support jaw 146a may limit movement of the mass body 180 in the height direction. Of course, the mass body 180 may be coupled to the support plate part 146 by an additional bonding method such as an adhesive bonding method, a welding method, or the like, in a state in which the mass body 180 is caught by the support jaw 146*a*.

Meanwhile, in the vibrator, the elastic member 140 provided in an internal space thereof may be excessively deformed by external force such as an externally applied impact, or the like. In this case, elastic force may be deteriorated by deformation exceeding an elastic limit of the elastic member 140, or the elastic member 140 may be damaged or deformed by a contact between the elastic member 140 and the housing 120. Therefore, a damper, a block, or the like, serving to absorb impact at the time of contact or serving as a stopper may be mounted between the housing 120 and the elastic member 140.

In addition, the piezoelectric element 160 may be provided on one surface of the elastic member 140 (more specifically, the bottom plate 142). More specifically, the piezoelectric element 160 may be integrated with the elastic member 140 using a predetermined medium. The piezoelectric element 160 may be fixedly mounted on a central portion of the elastic member 140 in the length direction.

The piezoelectric element 160 may be fixed to the elastic member 140 by soldering. That is, after applying solder cream 145 to the elastic member 140, the piezoelectric element 160 may be mounted thereon, and the piezoelectric element 160 may be fixed so as to be integrated with the elastic member 140 while the solder cream 145 is cured by a reflow method.

The solder cream 145 may be a mixture of at least one of lead powder or tin powder and a flux.

Here, the piezoelectric element 160 may include a metal layer 160*b* provided in a direction in which the piezoelectric element 160 is coupled to the elastic member 140. The metal layer 160*b* may allow the piezoelectric element 160 and the elastic member 140 to be further firmly coupled to each other by soldering. In addition, the metal layer 160*b* may be provided so as to cover an entire surface of the piezoelectric element 160.

Further, an insulating layer 160*a* may be provided between the piezoelectric element 160 and the metal layer 160*b*. The insulating layer 160*a* is provided, such that at the time of supplying power to the piezoelectric element 160, power leakages or short-circuits may be prevented.

The vibrator 100 as described above may be utilized in various electronic devices.

Figure 6:
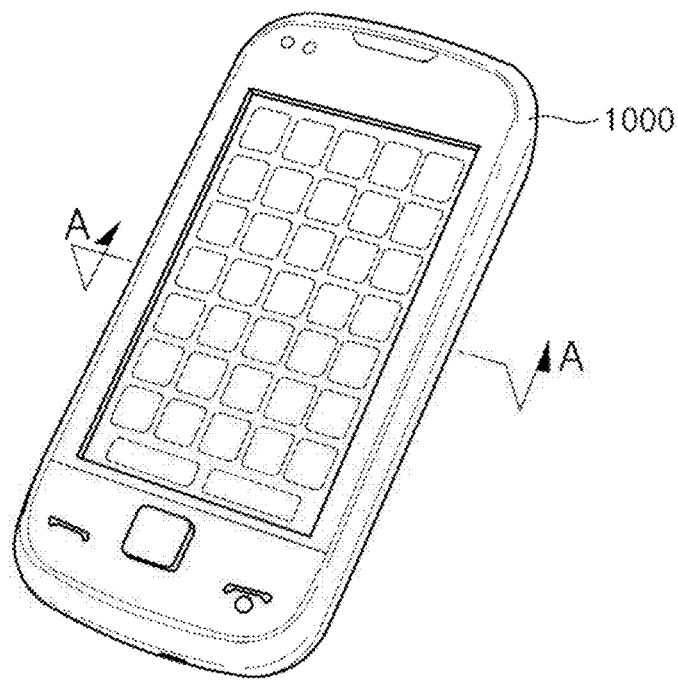
FIG. 6 is a perspective view of an electronic device according to an exemplary embodiment of the present disclosure.
Figure 7:
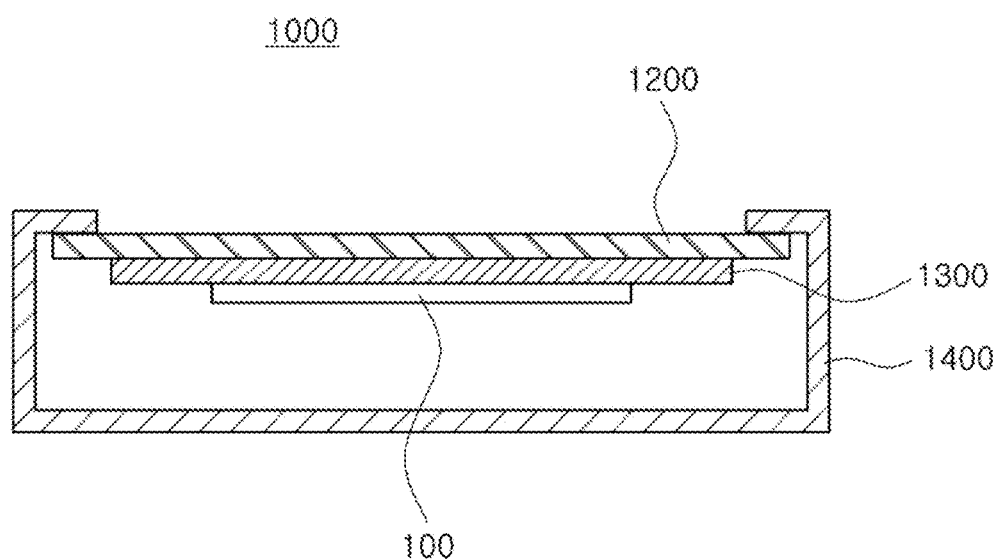
FIG. 7 is a cross-sectional view of the electronic device according to an exemplary embodiment of the present disclosure.
Figure 8:
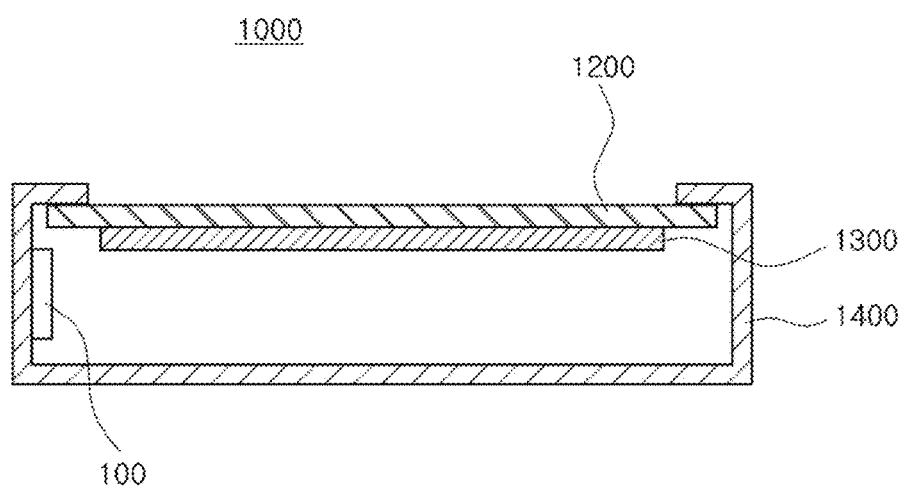
FIG. 8 is a cross-sectional view of an electronic device according to another exemplary embodiment of the present disclosure.

FIG. 6 is a perspective view of an electronic device according to an exemplary embodiment of the present disclosure, FIG. 7 is a cross-sectional view of the electronic device according to an exemplary embodiment of the present disclosure; and FIG. 8 is a cross-sectional view of an electronic device according to another exemplary embodiment of the present disclosure.

An electronic device 1000 according to the present disclosure may display an image depending on selection of a user as shown in FIGS. 6 through 8.

Referring to FIG. 7, the electronic device 1000 according to an exemplary embodiment of the present disclosure may be configured of a display module displaying an image depending on selection of a user and a case 1400 having an internal space receiving the display module.

The display module may be configured of a touch panel 1200 providing a touch pressure of the user and a display panel 1300 mounted on a lower surface of the touch panel 1200 to provide the image depending on user selection, and the vibrator 100 according to the present disclosure may be mounted on a lower surface of the display panel 1300 to provide vibrations, depending on user selection.

In addition, as shown in FIG. 8, the vibrator 100 according to the present disclosure may be mounted on an inner surface of the case 1400 to directly provide vibration to the display module.

As described above, according to the present disclosure, a vibrator and an electronic device using the same may be slimmed, lightened, and miniaturized, even in the case in which a weight is applied at a point at which displacement of a vibration plate is highest so as to increase driving force and then, an entire weight of the vibration plate is increased.

As set forth above, according to exemplary embodiments of the present disclosure, the coupling structure of the piezoelectric element and the elastic member capable of improving coupling strength between the piezoelectric element and the elastic member may be provided.

In addition, according to exemplary embodiments of the present disclosure, the structure of the vibrator capable of exhibiting excellent performance in view of productivity may be provided.

While exemplary embodiments have been shown and described above, it will be apparent to those skilled in the art that modifications and variations could be made without departing from the scope of the present invention as defined by the appended claims.

What is claimed is:

1. A vibrator comprising:
   a housing having an internal space;
   an elastic member having both ends fixed to the housing so as to be disposed in the internal space in a state in which elastic deformation is possible; and
   a piezoelectric element mounted on one surface of the elastic member and fixed to the elastic member by soldering,
   wherein the piezoelectric element includes a metal layer provided in a direction in which the piezoelectric element is coupled to the elastic member, and
   wherein the metal layer entirely covers one surface of the piezoelectric element.

2. The vibrator of claim 1, wherein the piezoelectric element is fixed to the elastic member by soldering via solder cream.

3. The vibrator of claim 2, wherein the solder cream is a mixture of any one of lead powder or tin powder and a flux.

4. The vibrator of claim 1, wherein the elastic member includes a bottom plate of which the piezoelectric element is mounted on one surface and an extension plate extended in a height direction from both ends of the bottom plate in a width direction.

5. The vibrator of claim 4, wherein the extension plate includes a connection part having one end connected to the bottom plate, and extended in the height direction from a central portion of the bottom plate in a length direction and a support plate part provided at the other end of the connection part in the length direction to guide a mass body.

6. A vibrator comprising:
   a housing having an internal space;
   an elastic member having both ends fixed to the housing so as to be disposed in the internal space in a state in which elastic deformation is possible; and
   a piezoelectric element mounted on one surface of the elastic member and fixed to the elastic member by soldering,
   wherein the piezoelectric element includes a metal layer provided in a direction in which the piezoelectric element is coupled to the elastic member, and
   wherein an insulating layer is provided between the metal layer and the piezoelectric element.

7. The vibrator of claim 6, wherein the elastic member includes a bottom plate of which the piezoelectric element is mounted on one surface and an extension plate extended in a height direction from both ends of the bottom plate in a width direction.

8. The vibrator of claim 7, wherein the extension plate includes a connection part having one end connected to the bottom plate, and extended in the height direction from a central portion of the bottom plate in a length direction and a support plate part provided at the other end of the connection part in the length direction to guide a mass body.

9. An electronic device comprising:
   a display module displaying an image depending on selection of a user;
   a case having an internal space receiving the display module; and
   a vibrator including:
      a housing mounted in the case and having an internal space;
      an elastic member mounted in the internal space;
      a piezoelectric element mounted on one surface of the elastic member by soldering via solder cream and vibrating the elastic member by deformation; and
      a mass body coupled to the elastic member while absorbing shocks,
      wherein the piezoelectric element includes a metal layer provided in a direction in which the piezoelectric element is coupled to the elastic member, and
      wherein the metal layer entirely covers one surface of the piezoelectric element.

10. The electronic device of claim 9, wherein the vibrator is mounted on an inner surface of the case.

11. The electronic device of claim 9, wherein the vibrator is mounted on a lower surface of the display module.

12. The electronic device of claim 9, wherein the display module includes:
   a touch panel receiving a touch interaction of a user; and
   a display panel coming in contact with a lower surface of the touch panel to provide a corresponding image depending the touch interaction with the touch panel.

* * * * *